US012612920B2

(12) United States Patent
Yeh

(10) Patent No.: US 12,612,920 B2
(45) Date of Patent: Apr. 28, 2026

(54) FAN MODULE AND ELECTRONIC DEVICE

(71) Applicant: Nanning FuLian FuGui Precision Industrial Co., Ltd., Nanning (CN)

(72) Inventor: Chih-Yu Yeh, New Taipei (TW)

(73) Assignee: Nanning FuLian FuGui Precision Industrial Co., Ltd., Nanning (CN)

( * ) Notice: Subject to any disclaimer, the term of this patent is extended or adjusted under 35 U.S.C. 154(b) by 0 days.

(21) Appl. No.: 19/185,505

(22) Filed: Apr. 22, 2025

(65) Prior Publication Data

US 2025/0250984 A1 Aug. 7, 2025

Related U.S. Application Data

(63) Continuation of application No. 18/201,302, filed on May 24, 2023, now Pat. No. 12,320,362.

(51) Int. Cl.
*F04D 25/14* (2006.01)
*F04D 19/00* (2006.01)
*F04D 29/64* (2006.01)
*H05K 7/20* (2006.01)

(52) U.S. Cl.
CPC ........... *F04D 25/14* (2013.01); *F04D 19/002* (2013.01); *F04D 29/646* (2013.01); *H05K 7/20181* (2013.01)

(58) Field of Classification Search
CPC ...................................................... F04D 25/14
See application file for complete search history.

(56) References Cited

U.S. PATENT DOCUMENTS

| | | | | | |
|---|---|---|---|---|---|
| 3,047,914 | A | * | 8/1962 | Kahn | E06B 7/084 |
| | | | | | 52/84 |
| 9,907,211 | B2 | * | 2/2018 | Campbell | H05K 7/20181 |
| 2012/0138262 | A1 | * | 6/2012 | Zhang | F04D 29/601 |
| | | | | | 165/67 |
| 2017/0321721 | A1 | * | 11/2017 | Huang | F04D 25/0613 |
| 2020/0325905 | A1 | * | 10/2020 | Smailes | F04D 29/703 |

* cited by examiner

*Primary Examiner* — Brian O Peters
(74) *Attorney, Agent, or Firm* — ScienBiziP, P.C.

(57) ABSTRACT

A fan module includes a mounting bracket, a fan and an anti-backflow device are detachably installed in the mounting bracket. The fan is configured to generate airflow along a predetermined direction, and the anti-backflow device allows the airflow to pass through. The fan is configured to generate airflow in another direction by being turned over, and the anti-backflow device allows the airflow in another direction to pass through be being turned over correspondingly. The anti-backflow device includes a louver assembly for one-way pass function. An electronic device includes the fan module is also provided.

16 Claims, 8 Drawing Sheets

100

10

14
13
15
17
16
15
11
12
19
18
19

FAN MODULE AND ELECTRONIC DEVICE

FIELD

The subject matter herein generally relates to heat dissipation devices, and particularly to a fan module structured and arranged for heat dissipation of electrical components and an electronic device including the fan module.

BACKGROUND

Switches typically require two or more fan modules for cooling. There are two types of switches available: heat exhaust switches and cold air intake switches. Different types of switches require fans to blow air in different directions to ensure that the cooling direction of the switch is consistent with other devices. In addition, existing fan modules for switches do not have anti-backflow devices, which may cause heated air that has already been discharged to be sucked back into the switch through a non-operating fan module, disrupting the cooling of the entire switch. In some special occasions, such as outdoor use, the air may contain dust, oil, or flying insects, which if accidentally sucked in by the fan, may also affect the normal operation and cooling of internal components of the switch.

BRIEF DESCRIPTION OF THE DRAWINGS

Implementations of the present technology will now be described, by way of example only, with reference to the attached figures, wherein.

DETAILED DESCRIPTION

Figure 1:
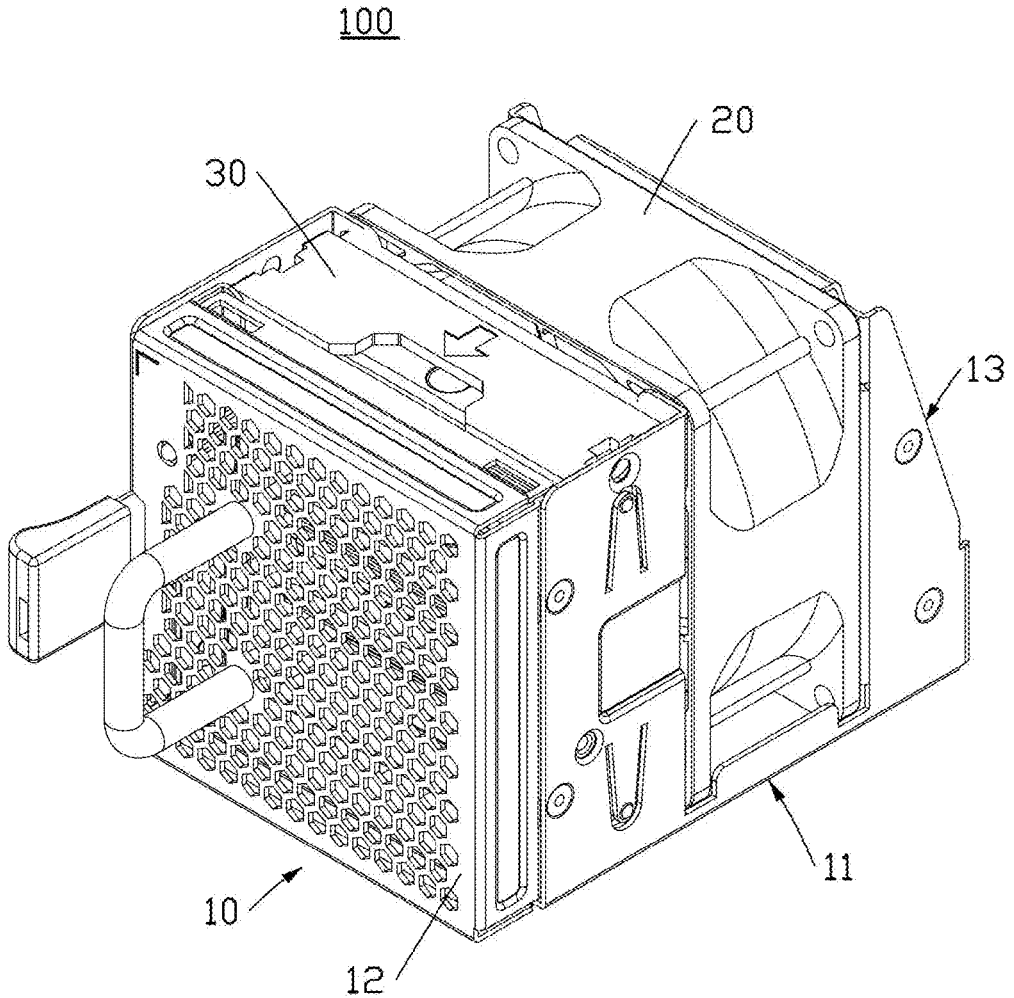
FIG. 1 is a perspective view of a fan module of an embodiment of the disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "inside" indicates that at least a portion of a region is partially contained within a boundary formed by the object. The term "comprising," when utilized, means "including, but not necessarily limited to"; it specifically indicates open-ended inclusion or membership in the so-described combination, group, series, and the like.

When a feature or element is herein referred to as being "on" another feature or element, it can be directly on the other feature or element or intervening features and/or elements may also be present. It will also be understood that, when a feature or element is referred to as being "connected" or "attached" to another feature or element, it can be directly connected, attached or coupled to the other feature or element or intervening features or elements may be present.

Figure 2:
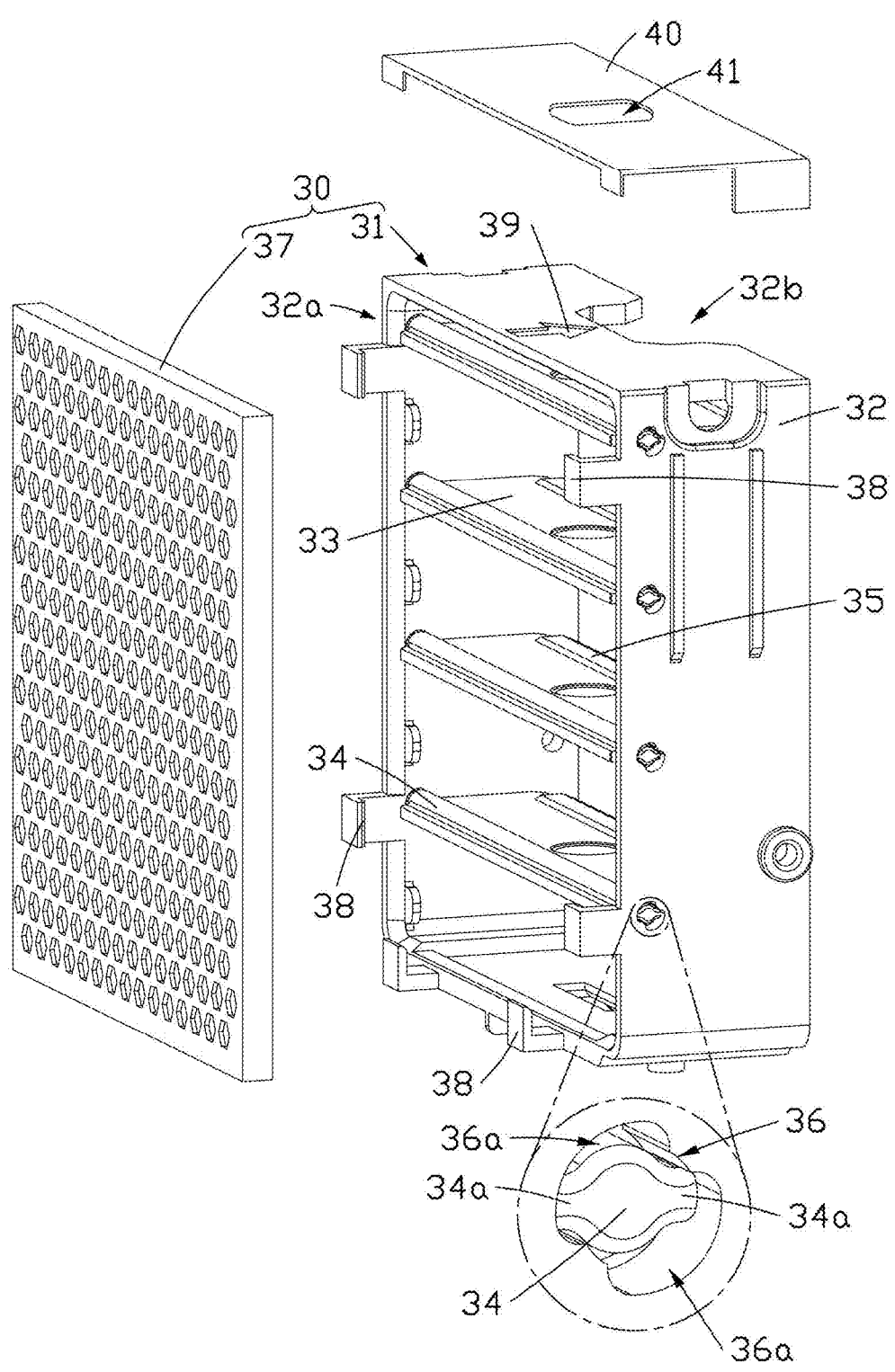
FIG. 2 is an explosive view of an anti-backflow device of the fan module in FIG. 1.

As shown in FIG. 1 and FIG. 2, an embodiment provides a fan module 100 for cooling electronic devices. The fan module 100 includes a mounting bracket 10, a fan 20 installed in the mounting bracket 10, and an anti-backflow device 30. The mounting bracket 10 includes a base 11 and a first side wall 12 and a second side wall 13 disposed at opposite ends of the base 11. The fan 20 is detachably installed between the first side wall 12 and the second side wall 13. The anti-backflow device 30 is detachably installed between the fan 20 and the first side wall 12, which includes a louver assembly 31. The louver assembly 31 includes a frame 32 and multiple blades 33 rotatably mounted to the frame 32. The frame 32 has an air inlet side 32a and an air outlet side 32b opposite the air inlet side 32a, providing an air flow channel for air passing through.

Figure 3:
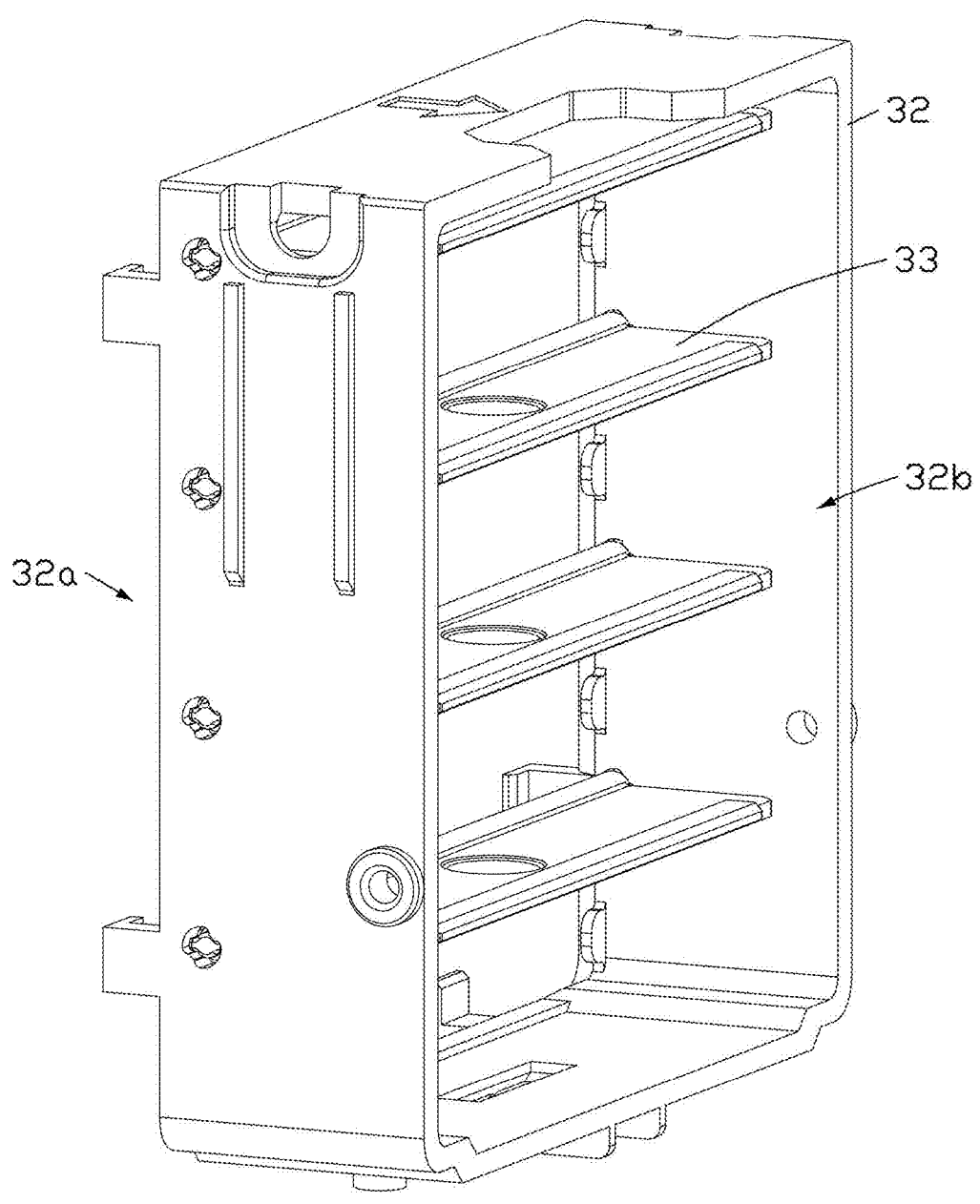
FIG. 3 is a perspective view of the anti-backflow device in FIG. 2, in an open state.
Figure 4:
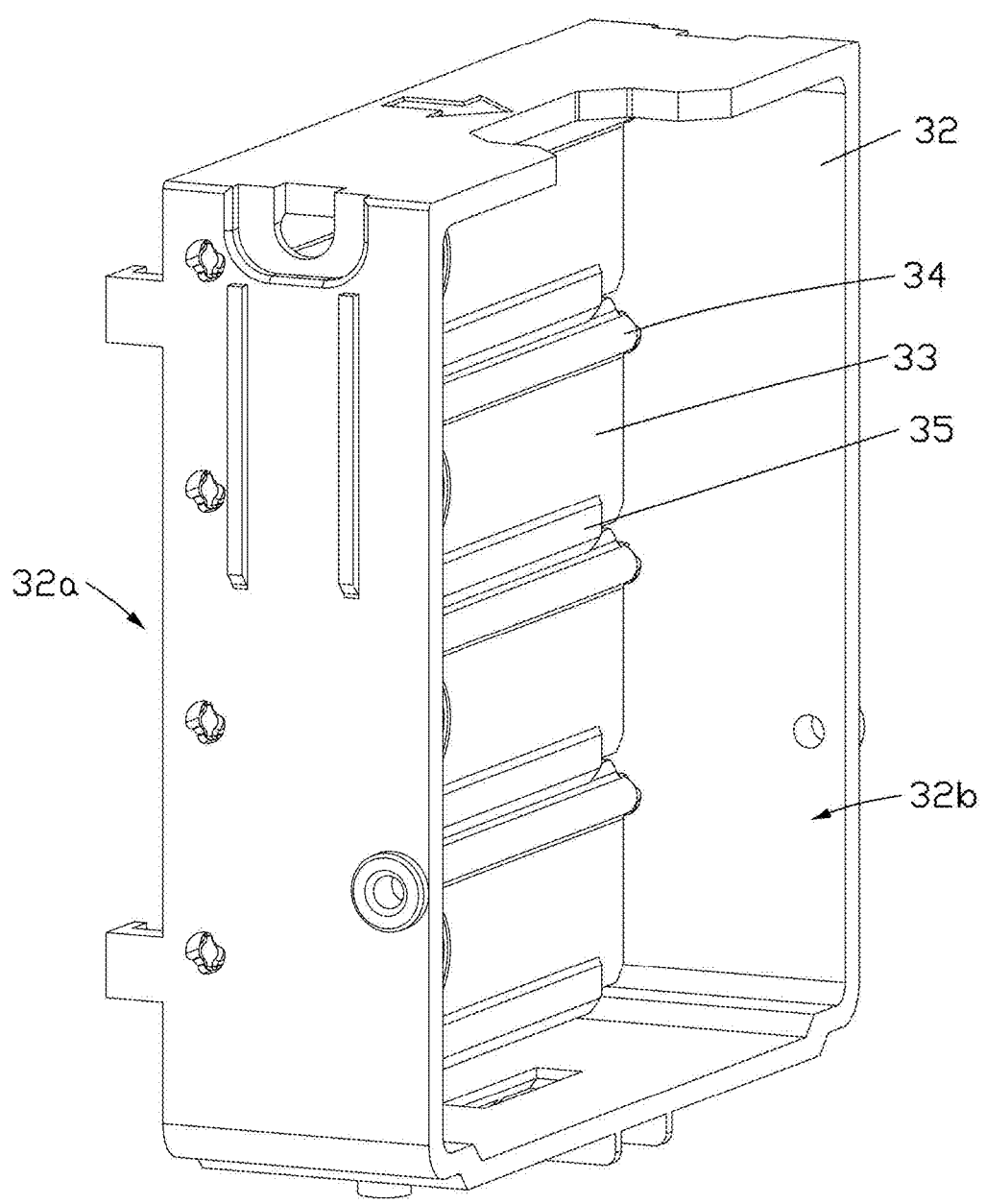
FIG. 4 is a perspective view of the anti-backflow device in FIG. 2, in an open state.

Specifically, in other embodiments, as shown in FIG. 2, FIG. 3, and FIG. 4, the louver assembly 31 includes a pivot shaft 34 for each blade 33. The blades 33 are pivotally mounted on the frame 32 through the pivot shafts 34. Each blade 33 is provided with a sealing strip 35 at an end away from the pivot shaft 34. The sealing strip 35 is configured for overlapping an adjacent blade 33 or the frame 32 to seal a gap allowing air passing through when the fan 20 stops working.

Thus, when the fan 20 stops working, the blades 33 rotate and drop under their own gravity, and the sealing strips 35 overlap with the adjacent blades 33 or the frame 32, closing the gap between the blades 33 or the gap between the blade 33 and the frame 32, improving the sealing effect of the airflow channel, preventing air from passing through the anti-backflow device 30 from the air outlet side 32b.

It can be understood that, when only one blade 33 is provided in the louver assembly 31 or when the blade 33 is at the bottom, the sealing strip 35 can close the gap between the blade 33 and the inside of the frame 32, further improving the sealing effect of the airflow channel and preventing air from passing through the anti-backflow device 30 from the air outlet side 32b.

In other embodiments, the frame 32 includes multiple pivot holes 36 corresponding to the pivot shafts 34 of the blades 33, and two ends of each pivot shaft 34 are disposed in the pivot holes 36. The pivot shaft 34 includes limit portions 34a on two opposite sides, and the pivot hole 36 includes limit slots 36a provided on opposite sides corresponding to the limit portions 34a. The limit slots 36a concave from the outer edge of the pivot hole 36, and the limit portions 34a are moveably received in the limit slots 36a and move along the limit slots 36a when the blades 33 rotate, which is used to limit rotating direction and angle of the pivot shaft 34.

Thus, the limit portions 34a and limit slots 36a limit the rotating direction and angle of the pivot shaft 34, and thereby control the blades 33 to rotate only within a certain range of natural droop and a specific angle towards the air outlet side 32b, to open or close the airflow channel. In this embodiment, the rotation range of the blades 33 is 0-90°, that is, the blades 33 can only rotate between natural droop to close the airflow channel and rotate 90° towards the air outlet side 32b to fully open the airflow channel.

In other embodiments, as shown in FIG. 2, the anti-backflow device 30 further includes a filter 37, which is removable mounted on the frame 32 and located at the air inlet side 32a of the frame 32.

In this way, the air passes through the filter 37 prior to the anti-backflow device 30, the filter 37 can prevent dust, oil sludge, and other impurities from entering the anti-backflow device 30 or the fan module 100.

In other embodiments, as shown in FIG. 2, there are multiple brackets 38 on the frame 32. The filter 37 is mounted on the frame 32 through inserting into the brackets 38 for easy replacement. In this embodiment, the brackets 38 are L-shaped. It should be understood that the brackets 38 can be of other shapes or structures, such as U-shaped or snap-on structures with snap function, as long as they are easy to attach the filter 37 and allow for easy removable connection of the filter 37.

In this embodiment, as shown in FIG. 2, there are six brackets 38 on three sides of the frame 32 for fixing the filter 37 together. In this way, when replacing the filter 37, it is only necessary to remove the filter 37 from the side of the frame 32 where no bracket 38 was set, and then insert a new filter 37.

Figure 5:
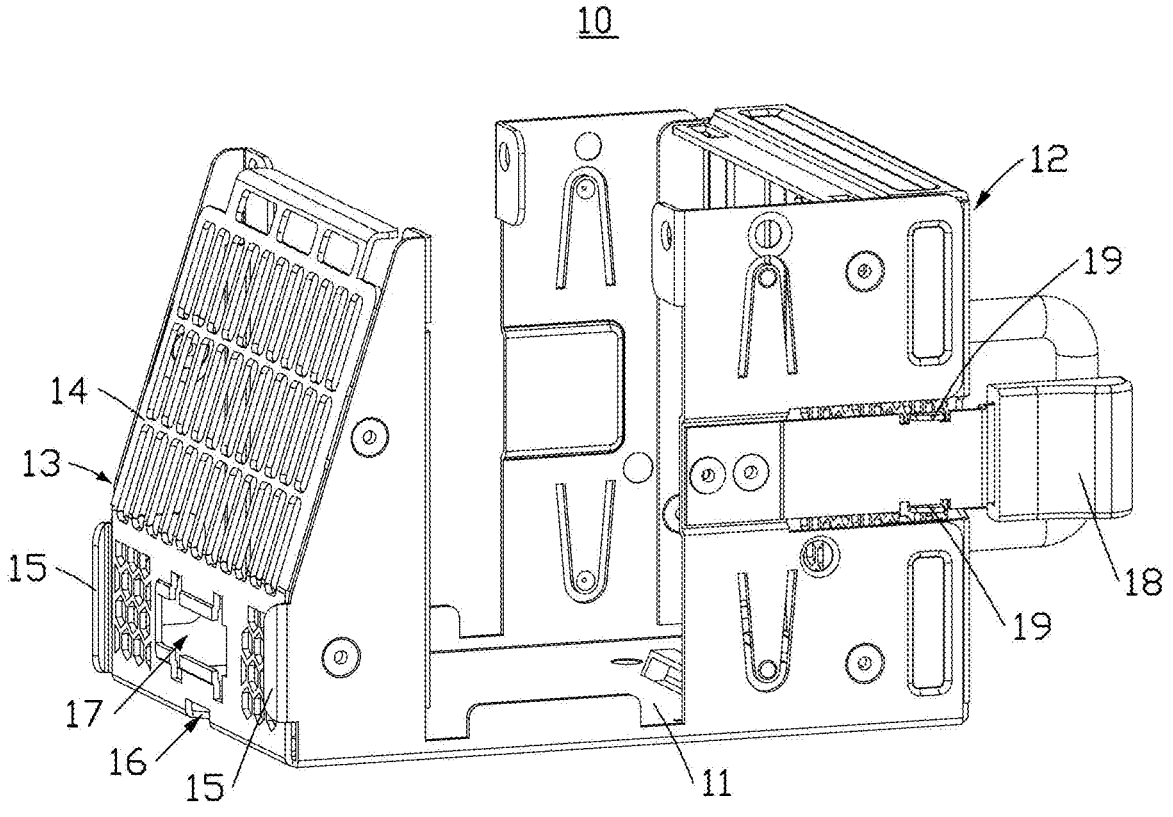
FIG. 5 is a perspective view of a mounting bracket of the fan module in FIG. 1.

In other embodiments, as shown in FIG. 5, the second side wall 13 of the mounting bracket 10 is provided with a guiding slope 14, which forms an acute angle with the plane where the base 11 is located; two guiding plates 15 are also provided on the second side wall 13, which are respectively set at the opposite ends of the second side wall 13 and inclined towards each other; a guiding groove 16 is defined on a side of the base 11 away from the fan 20, the guiding groove 16 is located at one end of the base 11 near the second side wall 13 and extends towards the first side wall 12; the guiding slope 14, guiding plates 15, and guiding groove 16 are used to guide the fan module 100 to be inserted and installed into an electronic device. In use, the fan module 100 is installed in an electronic device such as a switch for heat dissipation. The fan module 100 is inserted into the switch with the first side wall 12 facing outward and the second side wall 13 facing inward, and the guiding slope 14, guiding plates 15, and guiding groove 16 are used to guide the fan module 100 into place. Specifically, the electronic device has slots for installing the fan module 100, and the user can align the base 11 with the slot and push the fan module 100 into the slot under the guidance of the guiding plates 15 until it is fully installed. The guiding slope 14 makes it more convenient for the user to insert the fan module 100 into the slot.

In other embodiments, the second side wall 13 of the mounting bracket 10 defines a through hole 17 for accommodating a wiring terminal of the fan 20. When the fan module 100 is installed in an electronic device, such as a switch, the wiring terminals accommodated in the through hole 17 can be connected to the switch.

In other embodiments, the mounting bracket 10 is provided with a locking member 18 near the first side wall 12. The locking member 18 is elastically connected to the mounting bracket 10 and has a fixing portion 19 for fixing the fan module 100 after it is installed in place.

When the fan module 100 is installed in the electronic device, the fixing portion 19 is subjected to a pressure from the electronic device, causing the locking member 18 to deform and tilt towards the mounting bracket 10. After the fan module 100 is installed in place, the fixing portion 19 can be inserted into the electronic device under a restoring force of the locking member 18, thus fixing the fan module 100.

Figure 6:
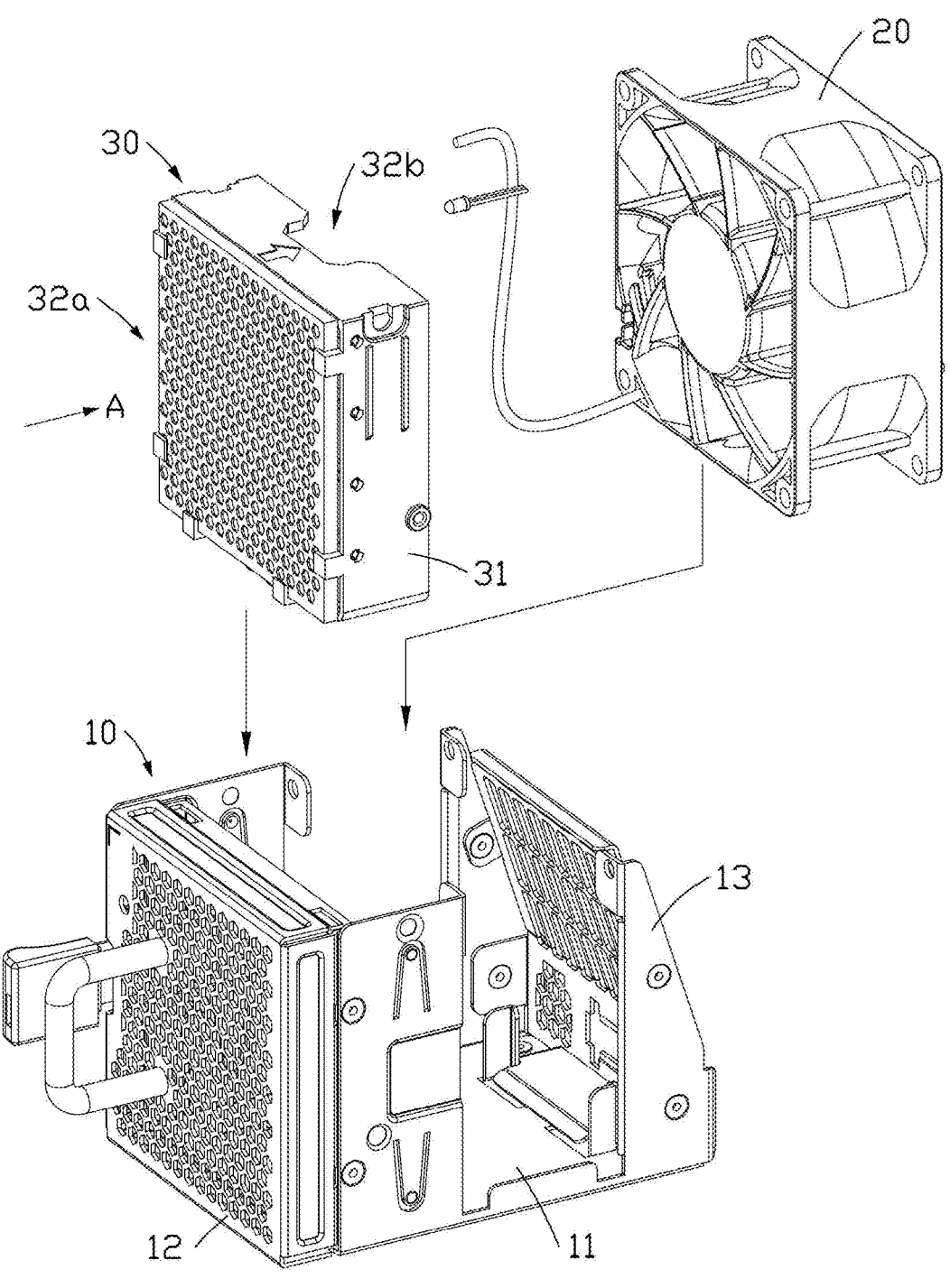
FIG. 6 is a perspective view of assembly of the fan module in FIG. 1, wherein the anti-backflow device is in a first state.

When in use, as shown in FIG. 6, the anti-backflow device 30 is configured to installed on the mounting bracket 10 in a first state, the air inlet side 32a of the frame 32 faces the first side wall 12, and the fan 20 is used to generate a first airflow A along a direction from the first side wall 12 to the second side wall 13. When the fan 20 generates the first airflow A, the blades 33 (as shown in FIG. 3) rotate towards the air outlet side 32b to open the airflow channel that allows the first airflow A to pass through. The blades 33 rotate to droop due to gravity to close the airflow passage when the fan 20 stops operating.

Figure 7:
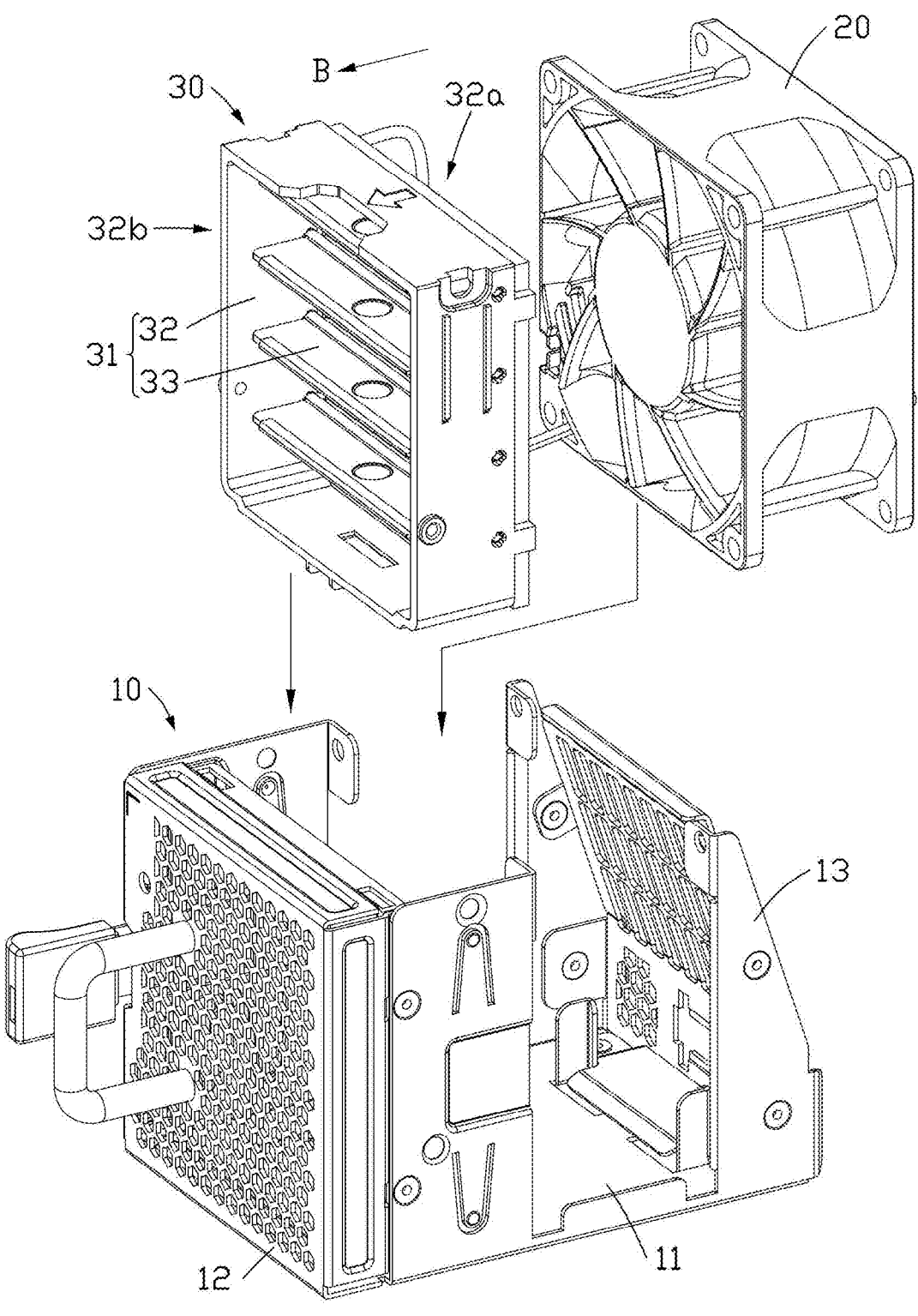
FIG. 7 is a perspective view of assembly of the fan module in FIG. 1, wherein the anti-backflow device is in a second state.

As shown in FIG. 7, the anti-backflow device 30 is configured to installed on the mounting bracket 10 in a second state, the air inlet side 32a of the frame 32 faces the second side wall 13, and the fan 20 is used to generate a second airflow B along a direction from the second side wall 13 to the first side wall 12. When the fan 20 generates the second airflow B, the blades 33 rotate to open towards the air outlet side 32b to form an airflow passage that allows the second airflow B to pass through. The blades 33 rotate to droop due to gravity to close the airflow passage when the fan 20 stops operating.

Thus, when using the fan module 100 provided by the disclosure, first determine the required airflow direction according to the installation environment of the fan module 100. For example, if the fan module 100 needs to be installed in a cold air intake type switch to provide external cold air for heat dissipation of the switch by generating airflow from the first side wall 12 towards the second side wall 13, then insert the anti-backflow device 30 in the first state into the mounting bracket 10 correspondingly. The fan 20 generates the first airflow A along the direction from the first side wall 12 to the second side wall 13 to supply external cold air to the cold air intake type switch for heat dissipation.

If the fan module 100 needs to be installed in a hot exhaust type switch to dissipate heated air generated in the switch by generating airflow from the second side wall 13 towards the first side wall 12, then insert the anti-backflow device 30 in the second state into the mounting bracket 10 correspondingly. The fan 20 generates the second airflow B along the direction from the second side wall 13 to the first side wall 12 to dissipate heated air for the hot exhaust type switch.

When the fan 20 is closed, in the absence of airflow or when the airflow direction is different from the airflow direction allowed by the anti-backflow device 30, the blade 33 rotates to close the airflow channel due to the pressure difference on both sides of the fan module 100 and the gravity of the blade 33, blocking the airflow passage and avoiding interference from airflow in different directions.

During use, the anti-backflow airflow device 30 can prevent the heated air that has already been exhausted from being sucked back in when the fan module 100 stops, such as when the fan module fails to operate. For example, when multiple fan modules 100 are installed on a hot exhaust type switch and are all oriented in the same direction for expelling the heated air from the switch, if some of the fan modules 100 fail and stop running, the blades 33 in the anti-backflow airflow device 30 in the malfunction fan modules 100 rotate and close the airflow channel due to the effects of the heated air blowing and its own gravity, avoiding the interference of sucked-in heated air with the overall heat dissipation.

The anti-backflow airflow device 30 can also prevent the cold air from being expelled from the failed fan module before entering the switch. For instance, when multiple fan modules 100 are installed on a cold air intake-type switch and are all oriented in the same direction for blowing cold air into the switch, if some of the fan modules 100 fail and stop running, the blades 33 in the anti-backflow airflow device 30 in the malfunction fan modules 100 rotate and close the airflow channel due to the effects of the cold air blowing and its own gravity, avoiding the phenomenon of recirculation caused by the cold air not effectively passing through the heat-generating components in the switch before being expelled.

In this embodiment, the switching between the first state and the second state of the anti-backflow device 30 is achieved by detaching the anti-backflow device 30 from the mounting bracket 10, turning it 180 degrees, and reinstalling it onto the mounting bracket 10. Correspondingly, the airflow generated by the fan 20 is switched between the first airflow and the second airflow by turning the fan 20 180 degrees and reinstalling it onto the mounting bracket 10. It should be understood that, in this embodiment, the fan 20 can only generate airflow in a single direction, and the direction of the airflow generated by the fan 20 needs to be switched by turning over the fan 20. In other embodiments, a fan with switchable direction can be used so that the direction of the airflow generated by the fan can be switched without adjusting the direction of the fan.

In other embodiments, the disclosure also provides a heat dissipation fan suitable for both hot air exhaust type switches and cold air intake type switches, which includes the fan module 100 as described in the previous embodiments.

In other embodiments, referring to FIG. 2, the frame 32 is provided with a marker 39 for indicating direction of the airflow generated by the fan 20, so that the user can confirm the state of the fan 20 or the anti-backflow device 30 without having to remove them when installing the fan module 100 on electronic devices such as switches.

In other embodiments, as shown in FIG. 2, the anti-backflow device 30 further includes a top cover 40, which is covered on the frame 32 and is opposite to the base 11. The top cover 40 is provided with a window 41 at a position corresponding to the marker 39.

Figure 8:
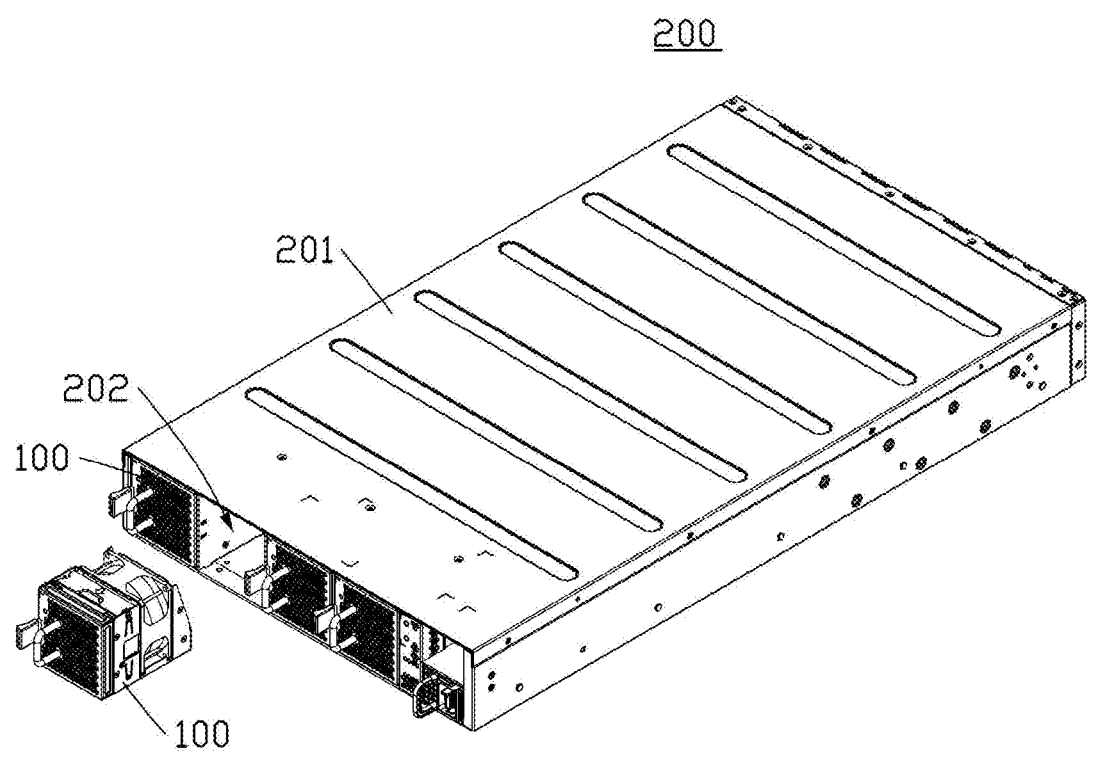
FIG. 8 is a perspective view of an electronic device of an embodiment of the disclosure.

Referring to FIG. 8, an electronic device 200 of an embodiment of the disclosure is provided. The electronic device 200 includes a casing 201 and a plurality of fan modules 100 above-mentioned. The casing 201 defines a plurality of vents 202, and the plurality of fan modules 100 are assembled in the vents 202.

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A fan module, comprising:

a mounting bracket comprising a base, a first side wall, and a second side wall, wherein the first side wall and the second side wall are disposed at respective opposite ends of the base;

a fan detachably installed in the mounting bracket, and located between the first side wall and the second side wall; and an anti-backflow device detachably installed in the mounting bracket, wherein the anti-backflow device is located between the fan and the first side wall, and the anti-backflow device comprises a louver assembly and a filter, the louver assembly comprises a frame and multiple blades rotatably mounted to the frame, and the filter is removable mounted on the frame;

wherein the second side wall comprises a guiding slope forming an acute angle with a plane defined by the base, and the guiding slope is configured for guiding the fan module to be inserted in position, wherein an airflow passage is formed by rotating the multiple blades to open thereby facilitating air flows, and the multiple blades rotate to drop to close when the fan stops rotating.

2. The fan module of claim 1, wherein the frame has an air inlet side and an air outlet side opposite to the air inlet side, an air flow channel is provided on the air inlet side, the air flow channel is configured for facilitating the air flows, and the filter is located at the air inlet side of the frame.

3. The fan module of claim 2, wherein when the anti-backflow device is installed in the mounting bracket in a first state, the air inlet side of the frame faces the first side wall, and the fan is configured to generate a first airflow along a direction from the first side wall to the second side wall;

when the anti-backflow device is installed in the mounting bracket in a second state, the air inlet side of the frame faces the second side wall, and the fan is configured to generate a second airflow along a direction from the second side wall to the first side wall; and the airflow passage is formed by rotating the multiple blades to open towards the air outlet side thereby facilitating the first airflow or the second airflow to flow.

4. The fan module of claim 3, wherein the frame further comprises a marker configured for indicating a direction of the first airflow, or a direction of the second airflow.

5. The fan module of claim 1, wherein the louver assembly includes a pivot shaft configured for each of the multiple blades, each of the multiple blades is pivotally mounted on the frame through the pivot shaft, each of the multiple blades is provided with a sealing strip at an end away from the pivot shaft, the sealing strip is configured for sealing the air flow passage when the fan stops operating.

6. The fan module of claim 5, wherein the frame further defines multiple pairs of pivot holes corresponding to the pivot shaft of each of the multiple blades, two ends of the pivot shaft are respectively disposed in a corresponding pair of the multiple pair of pivot holes;

the pivot shaft comprises limit portions on two opposite sides, and each pivot hole comprises limit slots provided on opposite sides corresponding to the limit portions;

the limit slots concave from outer edge of the pivot hole, and the limit portions are moveably received in the limit slots and move along the limit slots when the multiple blades rotate.

7. The fan module of claim 1, wherein the frame comprises multiple brackets for supporting the filter.

8. The fan module of claim 1, wherein the second side wall of the mounting bracket defines a through hole for accommodating a wiring terminal of the fan.

9. The fan module of claim 8, wherein the mounting bracket is provided with a locking member near the first side wall;

the locking member is elastically connected to the mounting bracket and has a fixing portion for fixing the fan module after it is installed in place.

10. An electronic device, comprising:

a casing defining a plurality of vents; and a plurality of fan modules assembled in the plurality of vents, each of the plurality of fan modules comprising:

a mounting bracket comprising a base, a first side wall, and a second side wall, wherein the first side wall and the second side wall are disposed at respective opposite ends of the base;

a fan detachably installed in the mounting bracket, and located between the first side wall and the second side wall; and an anti-backflow device detachably installed in the mounting bracket, wherein the anti-backflow device is located between the fan and the first side wall, and the anti-backflow device comprising a louver assembly and a filter, the louver assembly comprises a frame and multiple blades rotatably mounted to the frame, and the filter removable mounted on the frame;

wherein the second side wall comprises a guiding slope forming an acute angle with a plane defined by the base, and the guiding slope is configured for guiding the fan module to be inserted in position, wherein the multiple blades rotate to open to form an airflow passage that allows air passing through, the multiple blades rotate to droop to close when the fan stops operating.

11. The fan module of claim 10, wherein the frame has an air inlet side and an air outlet side opposite to the air inlet side for providing an air flow channel for air passing through, and the filter is located at the air inlet side of the frame, when the anti-backflow device is installed on the mounting bracket in a first state, the air inlet side of the frame faces the first side wall, and the fan is used to generate a first airflow along a direction from the first side wall to the second side wall;

when the anti-backflow device is installed in the mounting bracket in a second state, the air inlet side of the frame faces the second side wall, and the fan is used to generate a second airflow along a direction from the second side wall to the first side wall.

12. The electronic device of claim 10, wherein the louver assembly includes a pivot shaft for each of the multiple blades, each of the multiple blades is pivotally mounted on the frame through the pivot shaft, each of the multiple blades is provided with a sealing strip at an end away from the pivot shaft, the sealing strip is configured for sealing the air flow passage when the fan stops operating.

13. The electronic device of claim 12, wherein the frame defines multiple pair of pivot holes corresponding to the pivot shafts of the multiple blades, two ends of each of the pivot shafts are disposed in one pair of the multiple pair of pivot holes;

the pivot shaft comprises limit portions on two opposite sides, and each pivot hole comprises limit slots provided on opposite sides corresponding to the limit portions;

the limit slots concave from outer edge of the pivot hole, and the limit portions are moveably received in the limit slots and move along the limit slots when the multiple blades rotate.

14. The electronic device of claim 10, wherein the frame comprises multiple brackets for supporting the filter.

15. The electronic device of claim 10, wherein the second side wall of the mounting bracket defines a through hole for accommodating a wiring terminal of the fan.

16. The electronic device of claim 15, wherein the mounting bracket is provided with a locking member near the first side wall;

the locking member is elastically connected to the mounting bracket and has a fixing portion for fixing the fan module after it is installed in place.

\* \* \* \* \*